US00RE36777E

United States Patent [19]

Larsen et al.

[11] E Patent Number: Re. 36,777

[45] Reissued Date of Patent: Jul. 11, 2000

[54] INTEGRATION OF HIGH PERFORMANCE SUBMICRON CMOS AND DUAL-POLY NON-VOLATILE MEMORY DEVICES USING A THIRD POLYSILICON LAYER

[75] Inventors: Bradley J. Larsen, Woodland Park; Todd A. Randazzo; Donald A. Erickson, both of Colorado Springs, all of Colo.

[73] Assignee: Atmel Corporation, San Jose, Calif.

[21] Appl. No.: 09/167,919

[22] Filed: Oct. 7, 1998

Related U.S. Patent Documents

Reissue of:

[64] Patent No.: 5,340,764
Issued: Aug. 23, 1994
Appl. No.: 08/020,291
Filed: Feb. 19, 1993

[51] Int. Cl.[7] ..... H01L 29/34; H01L 29/78

[52] U.S. Cl. ..... 438/79; 438/72; 438/333; 438/337; 257/369; 257/385; 257/314

[58] Field of Search ..... 438/72, 79, 333, 438/337; 257/369, 314, 385

[56] References Cited

U.S. PATENT DOCUMENTS 5,175,120 12/1992 Lee ..... 437/48
5,188,976 2/1993 Kume et al. ..... 435/52
5,194,924 3/1993 Komori et al. ..... 257/316

FOREIGN PATENT DOCUMENTS

0435534A2 7/1991 European Pat. Off. .
58-184768 10/1983 Japan .
62-150781 7/1987 Japan .
4348072 12/1992 Japan .

OTHER PUBLICATIONS

F. Masuoka et al., "A 256–kbit Flash $E^2$PROM Using Triple–Polysilicon Technology", IEEE Journal of Solid–State Circuits, vol. SC–22, No. 4, Aug. 1987, pp. 548–552.

*Primary Examiner*—Edward Wojciechowicz
*Attorney, Agent, or Firm*—Thomas Schneck; Mark Protsik

[57] ABSTRACT

An apparatus and method for integrating a submicron CMOS device and a non-volatile memory, wherein a thermal oxide layer is formed over a semiconductor substrate and a two layered polysilicon non-volatile memory device formed thereon. A portion of the thermal oxide is removed by etching, a thin gate oxide and a third layer of polysilicon having a submicron depth is deposited onto the etched region. The layer of polysilicon is used as the gate for the submicron CMOS device. In so doing a submicron CMOS device may be formed without subjecting the device to the significant re-oxidation required in formation processes for dual poly non-volatile memory devices such as EPROMs and EEPROMs, and separate device optimization is achieved.

13 Claims, 3 Drawing Sheets

INTEGRATION OF HIGH PERFORMANCE SUBMICRON CMOS AND DUAL-POLY NON-VOLATILE MEMORY DEVICES USING A THIRD POLYSILICON LAYER

Matter enclosed in heavy brackets [ ] appears in the original patent but forms no part of this reissue specification; matter printed in italics indicates the additions made by reissue.

TECHNICAL FIELD

The present invention pertains to semiconductor devices. Specifically, the present invention pertains to the integration of submicron CMOS devices with non-volatile memory devices.

BACKGROUND ART

Erasable programmable read only memories, known as EPROMs, and electrically erasable programmable read only memories, known as EEPROMs, are well known "floating gate" devices of the art. Typically, these double layer polysilicon non-volatile memory devices are programmed and accessed using a separate device which is electrically coupled to the memory device. In the past, such programming and accessing has been accomplished using a transistor formed during the formation of the memory device. That is, the formation of the transistor was incorporated into the manufacturing process flow of the memory device. Specifically, as the second layer of polysilicon was deposited to form the memory cell, the polysilicon was also deposited onto a separate region of the substrate. A transistor was then formed in that separate region having the second layer of polysilicon as one of the gates of the device. Incorporating the formation of the transistor into the manufacturing process flow was considered to be advantageous in that it simplified the manufacturing processes required in the formation of the devices.

Accessing the floating gate device using a high performance submicrons CMOS transistor would be especially beneficial due to the high speed at which the submicron CMOS device operates. However, several incompatibilities exist which inhibit integrating the formation of submicron CMOS devices, such as high performance N-channel and P-channel transistors, with the manufacturing processes used to form double layer polysilicon non-volatile memory devices such as EPROMs and EEPROMs.

Floating gate devices, such as EPROMs and EEPROMs, require significant oxidation after the deposition of each of the polysilicon layers forming these devices. Multiple poly re-oxidations are necessary to achieve adequate charge retention characteristics. Unfortunately, submicron CMOS devices experience significant transconductance and reliability degradation when exposed to excessive poly re-oxidation. As a result, performance of submicron CMOS devices exposed to dual-poly formation processes is prohibitively reduced. Specifically, as submicron polysilicon gates are exposed to repeated oxidation, the edges of the gates tend to lift from the substrate due to oxidation of the gate edges. This decouples the gate from the channel region. As a result, gain degradation and hot electron reliability problems occur. Additionally, the re-oxidation thermal cycle causes dopant diffusion of the channel's voltage adjust implant.

Furthermore, the operation of dual-poly non-volatile memory devices is often incompatible with the use of high performance submicron CMOS devices. EPROMs and EEPROMs frequently require relatively high programming voltages of 12–18 volts. Such voltages are incompatible with thin gate oxides and lower diode breakdowns found in submicron CMOS devices. Submicron CMOS devices typically have thin gate oxide thicknesses of less than 200 angstroms. A gate oxide of less than 200 angstroms, however, has an intrinsic breakdown of approximately 15 volts. Therefore, the programming voltages utilized in dual-poly non-volatile memory elements essentially destroy high performance submicron CMOS devices.

Therefore it is an object of the present invention to successfully integrate the formation and use of high performance submicron CMOS devices with the manufacture and operation of dual-poly non-volatile memory devices.

SUMMARY OF THE INVENTION

This object has been achieved by depositing a third layer of polysilicon associated with a non-volatile memory device as one of the gates of a high performance submicron CMOS device. This is done in a manner which decouples the processing for the high performance CMOS device from the processing for the non-volatile memory device allowing for separate optimization of the two device types. We form a layer of thermal oxide over a dual-poly non-volatile memory device and over the portion of the surface of the semiconductor substrate on which the high performance CMOS device is to be formed. The thermal oxide is then removed from the active area on the substrate where the high performance submicron CMOS device is to be formed.

A thin gate oxide is formed over the active area, and a threshold voltage adjust implant is performed. A third layer of polysilicon is then deposited over the non-volatile memory device and the surface of the semiconductor substrate. The third layer of polysilicon is doped and selectively removed from the surface of the semiconductor substrate such that the doped layer of polysilicon is removed from everywhere on the substrate except for the active region where the submicron device gates are to be formed.

A high performance submicron CMOS device having a source, drain and gate, is then formed using the portion of the doped polysilicon layer remaining in the active region as a gate. Metallized contacts are made to the submicron CMOS device, and the device is covered with a protective coating.

Because the devices are formed at separate times, separate optimization of dual-poly non-volatile memory devices and high performance submicron CMOS devices is possible. Additionally, the present invention allows the submicron CMOS device to be decoupled from the source and drain diffusion cycles required to achieve higher junction breakthrough voltages in non-volatile memory devices. Furthermore, the separate optimization can be achieved without compromising the characteristics or reliability of either of the devices.

BEST MODE FOR CARRYING OUT THE INVENTION

Figure 1A:
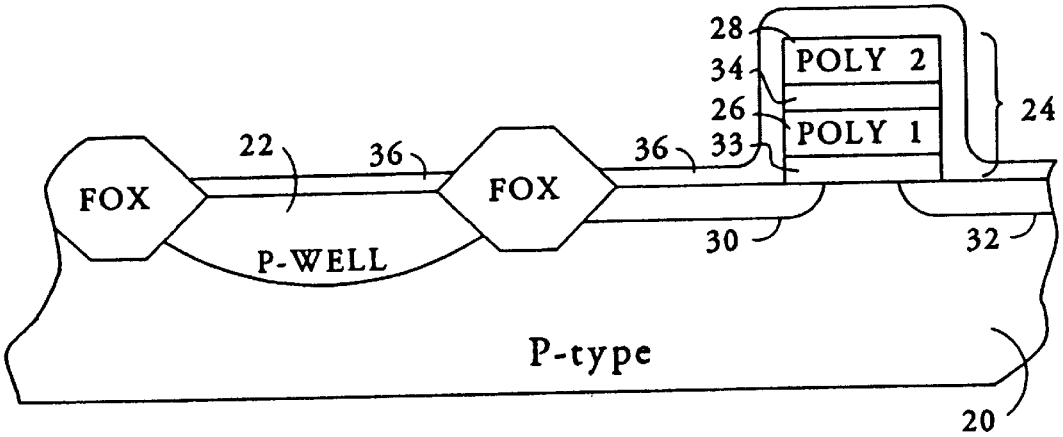
FIGS. 1A–E are side sectional views of the steps used in the integration of the high performance submicron CMOS device and the dual-poly non-volatile memory device in accord with the present invention.

With reference to FIG. 1A, a cross-sectional view of the starting step in the formation of the present invention is shown. A p-doped silicon substrate 20 containing a p-doped well 22 and having an EPROM 24 formed thereon is shown. Although the semiconductor substrate 20 is formed of silicon in the preferred embodiment, any other suitable semiconductor material may be used. Additionally, the substrate 20 may also have a different conductivity type if desired. Further, although an EPROM 24 is used in the preferred embodiment, an EEPROM is also compatible with the methods of the present invention.

The EPROM 24 is formed of two stacked and aligned layers of polysilicon, 26 and 28, formed over a high voltage source 30 and drain 32, and separated from the substrate 24 by a thick gate oxide layer 33. The two layers of polysilicon, 26 and 28, are separated by an insulating dielectric layer 34, and are subjected to re-oxidation. After re-oxidation of the two polysilicon layers, 26 and 28, a layer of thermal oxide 36 is formed over the EPROM 24 and the silicon substrate 20. In the preferred embodiment of the present invention, the thermal oxide 36 is formed to a depth of approximately 200 angstroms.

Figure 1B:
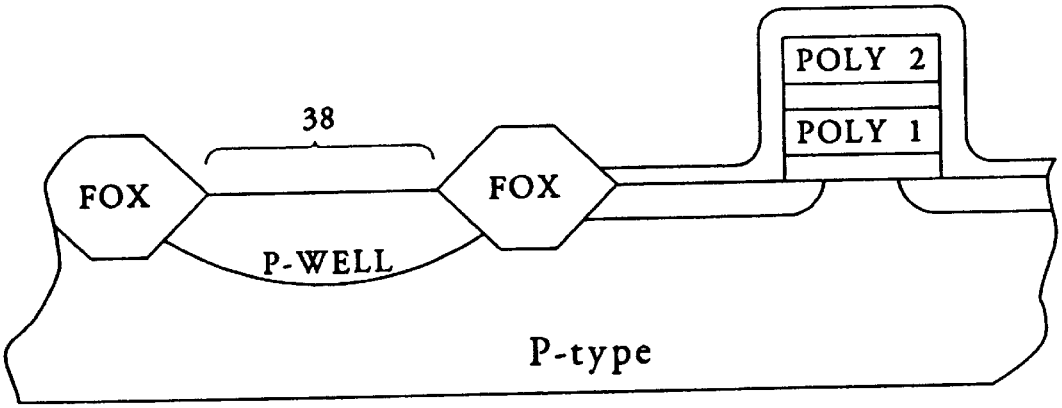

As shown in FIG. 1B, the thermal oxide layer 36 is then removed from a region 38 of the silicon substrate 20 above the p-doped well 22. In so doing, the thermal oxide 36 is cleared from the active region 38 of the silicon substrate 20 where the thin gate oxide layer of the high performance submicron CMOS transistor is to be formed. In the preferred embodiment, the thermal oxide 36 is removed using a wet HF etch, however, any of the numerous etching techniques well known in the art are suitable.

Figure 1C:
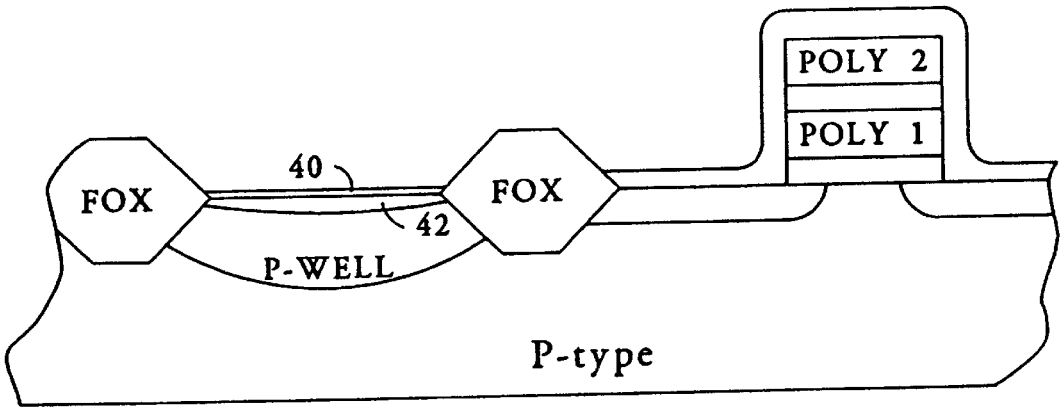

Referring now to FIG. 1C, a thin gate oxide layer 40 is formed in the active region 38 of the silicon substrate 20. The gate oxide 40 is typically formed to a thickness of approximately 100 to 150 angstroms. In forming the thin gate oxide 40, additional re-oxidation also occurs in the two polysilicon layers, 26 and 28, of the EPROM 24. As a result the polysilicon layers, 26 and 28, are oxidized to a final thickness of about 500 angstroms. After the formation of the thin gate oxide 40, an enhancement implant 42 is made into the p-doped region 22 of the silicon substrate 20. Enhancement implant 42 is a light dose implant of $BF_2$, or any other well known dopant, which is used to adjust the threshold voltage of the high performance submicron CMOS transistor.

Figure 1D:
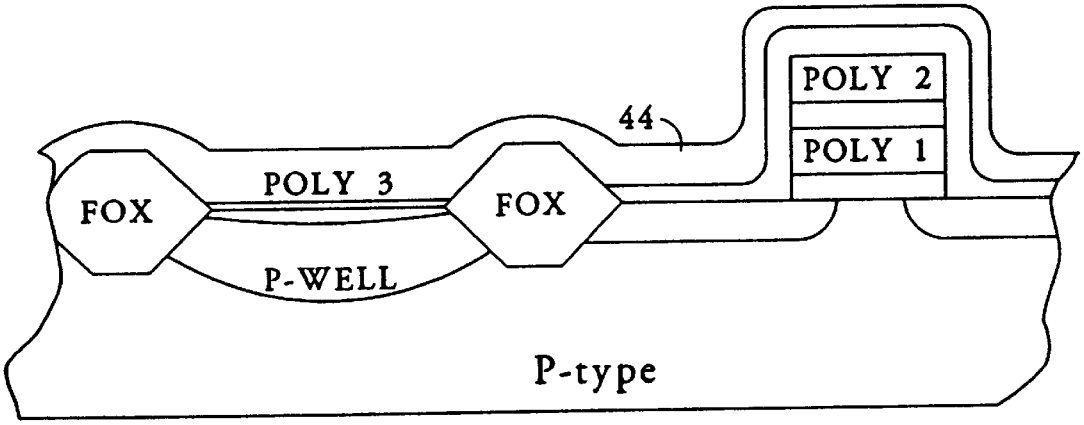

With reference to FIG. 1D, a third layer of polysilicon 44 is deposited over the surface of the silicon substrate. As a result, both the thin gate oxide 40 and the EPROM 24 are covered by the layer of polysilicon 44. The polysilicon 44 is typically deposited to a thickness of about 2000 to 5000 angstroms. The third layer of polysilicon 44 is then doped with an n-type dopant such as phosphorous, producing an $n^+$ type conductivity in the third polysilicon layer 44.

Figure 1E:
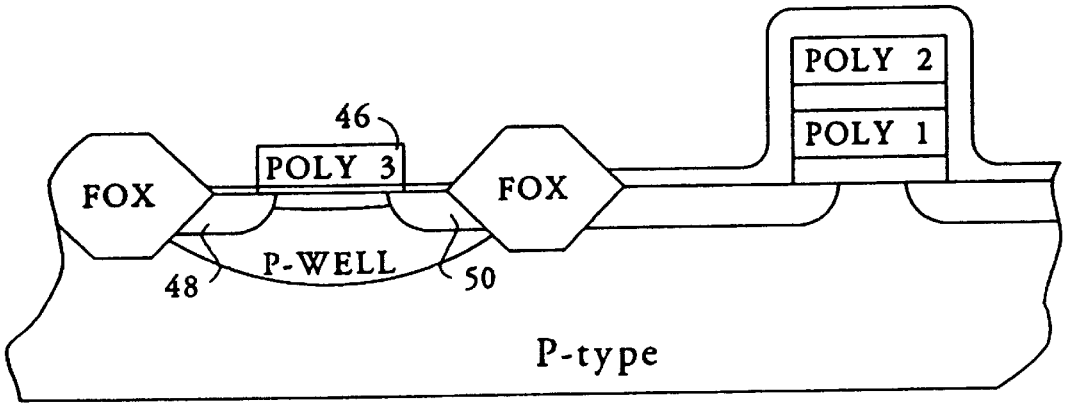

As shown in FIG. 1E, the third doped layer of polysilicon 44 is then removed from everywhere on the silicon substrate 20 except for the area above the thin gate oxide 40. In so doing, a gate region 46 for the high performance submicron CMOS transistor is formed. In forming gate 46 of the high performance submicron CMOS transistor from third polysilicon layer 44, the submicron CMOS device is effectively decoupled from the EPROM device 24, allowing for separate optimization of the two devices. As a result, the transistor is not adversely affected by the high programming voltages, 12–20 volts, necessary for the EPROM 24. An additional etch step is then performed in order to remove any residual polysilicon that may have been deposited onto the sidewalls of the first two polysilicon layers, 26 and 28, during the deposition of the submicron third polysilicon layer 44.

The formation of the submicron CMOS transistor is completed by implanting a low voltage source 48 and drain 50, and forming metallized contacts, not shown, to low voltage source 48 and drain 50, and gate 46. The device is then covered with a protective coating. In the preferred embodiment of the present invention, an N-channel type high performance submicron CMOS transistor is formed. However, the methods of the present invention would also apply to the formation of a P-channel type high performance submicron transistor, by forming the transistor in an n-doped well containing a p-doped source and drain region.

Figure 2:
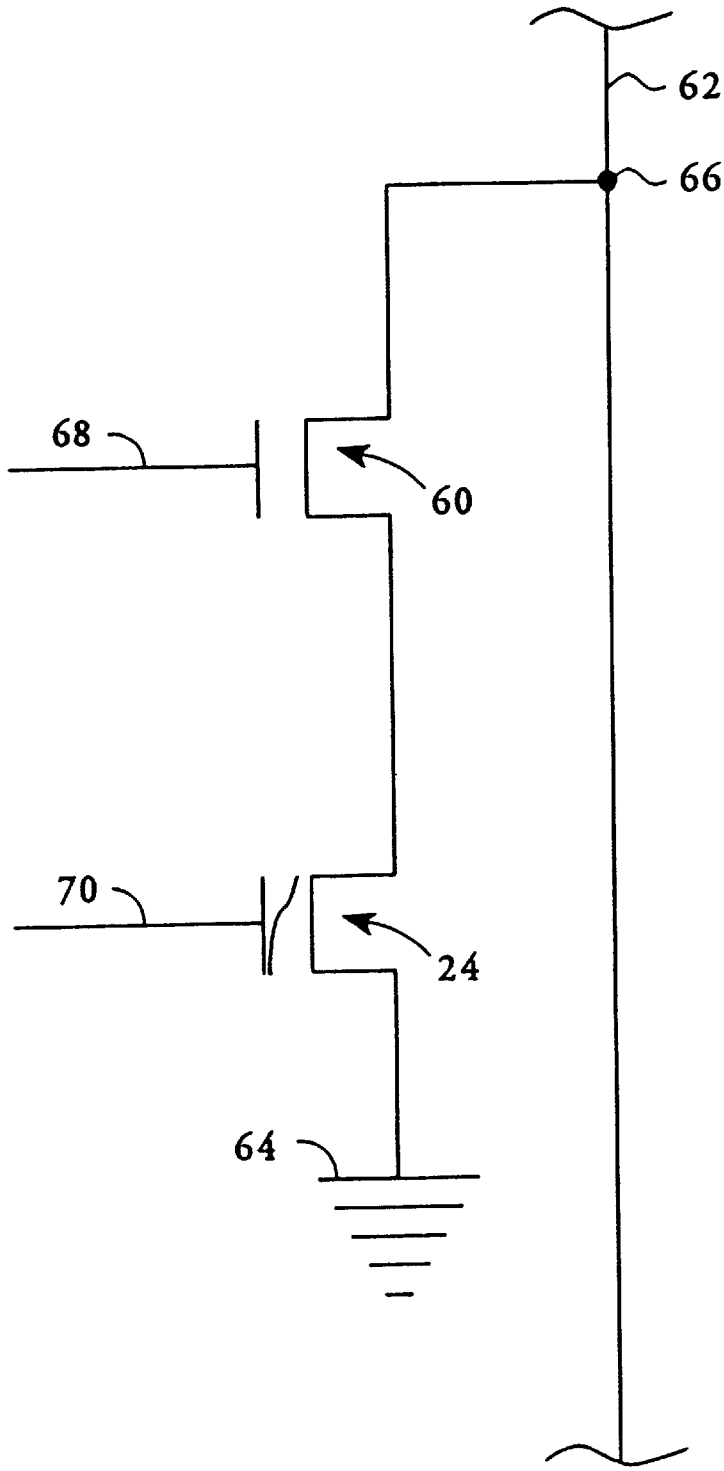
FIG. 2 is a circuit diagram of the integrated high performance submicron CMOS device and the dual-poly non-volatile memory device in accord with the present invention.

Referring now to FIG. 2, a circuit diagram illustrating the integration of the submicron CMOS device and EPROM 24 of the present invention is shown. EPROM 24 and high performance sub-micron CMOS transistor 60, used to access EPROM 24, are coupled in series between column line 62 and ground line 64. The drain terminal of submicron CMOS transistor 60 is connected to column line 62 through metal contact 66. The gate of transistor 60 is coupled to access line 68. Additionally, the gate of EPROM 24 is coupled to a read line 70. In so doing, high speed submicron CMOS transistor 60, may be used to access EPROM 24.

Referring again to FIG. 1, the present invention as described above has several advantages over the prior art. The third polysilicon layer 44 allows the high performance submicron CMOS transistor to be formed without having to be subjected to the significant re-oxidations required in the formation of the EPROM 24.

By using a submicron CMOS transistor, the EPROM can be accessed and read at higher speeds than were possible with the standard transistors of the prior art. Additionally, the third layer of polysilicon 44 decouples the submicron CMOS transistor and the EPROM 24 such that they may be separately optimized. As a result, both of the devices can be utilized without compromising the characteristics or reliability of the other.

Additionally, the two devices can be manufactured in the same process flow, thereby reducing the manufacturing cost of the system, by eliminating manufacturing steps, while simultaneously improving the yield and reliability of the manufacturing processes.

We claim:

1. A method for forming *each of a plurality of non-volatile memory cells in an array of such cells, each of said non-volatile memory cells including* a submicron *CMOS* transistor adjacent to a non-volatile memory *floating-gate* transistor, *said method* comprising the steps of:

(*a*) providing a semiconductor substrate of a first conductivity type[.];

(*b*) forming a non-volatile memory *floating-gate* transistor on a first region of said semiconductor substrate[,]; including (*i*) forming a first gate oxide layer on said substrate, (*ii*) forming a first polysilicon layer on said first gate oxide layer, (*iii*) forming a second gate oxide layer on said *first* polysilicon layer, (*iv*) *forming a second polysilicon layer on said second gate oxide layer,*

(*v*) selectively etching said *first and second* gate oxide and polysilicon layers to leave a pair of polysilicon gates stacked above a section of said first region, said gates separated from each other by said second gate oxide layer and separated from said substrate by said first gate oxide layer, *and*

(*vi*) forming doped *source and drain* regions of a second conductivity type in said first region proximate to said pair of gates, (*c*) forming a thermal oxide layer over said non-volatile memory [device] *floating-gate transistor* and said semiconductor substrate, *said thermal oxide layer being formed to a first thickness which is a predetermined fraction of a desired final thermal oxide thickness, wherein said final thickness is sufficient to withstand a programming voltage of at least 12 volts;*

(*d*) *completely* removing said thermal oxide *layer* from a second region of said substrate *such that the surface of said second region is left bare*, said second region *adjacent to but* separated from said first region by a field oxide region[,];

(*e*) forming a third gate oxide layer over said *first and* second [region] *regions* of said substrate, *said third gate oxide layer being formed to a second thickness such that the sum of said first and second thicknesses is substantially equal to said desired final thermal oxide thickness;*

(*f*) forming a third layer of polysilicon over said non-volatile memory [device] *floating-gate transistor* and said third gate oxide layer[,];

(*g*) selectively removing said third layer of polysilicon such that said third layer of polysilicon is removed from everywhere except for atop a portion *of* said second region[,];

(*h*) forming a submicron CMOS transistor, including implanting dopants of said second conductivity type into said second region of said substrate adjacent to said portion under said third layer of polysilicon[,] *to form source and drain regions of said submicron CMOS transistor;*

(*i*) forming metallized contacts to said submicron CMOS transistor and said non-volatile memory *floating-gate* transistor, *said contacts coupling the drain of said non-volatile memory floating-gate transistor to the source of said submicron CMOS transistor, coupling the drain of said submicron CMOS transistor to a bitline of the array, coupling the source of said non-volatile memory floating-gate transistor to a ground potential, coupling the third layer of polysilicon forming a control gate of said submicron CMOS transistor to an access line, and coupling the second polysilicon layer forming a control gate of said non-volatile memory floating-gate transistor to a read line,* and (*j*) covering said semiconductor substrate including said submicron CMOS transistor and said non-volatile memory *floating-gate* transistor with a protective coating.

2. The method as recited in claim 1 further comprising:

oxidizing said pair of *polysilicon* gates, prior to forming said thermal oxide layer over said non-volatile memory [device] *floating-gate transistor*, whereby charge retention characteristics of said *polysilicon* gates are enhanced without impairing performance of said submicron CMOS transistor.

3. The method as recited in claim 1 wherein forming said non-volatile memory [trnasistor] *floating-gate transistor* further comprises the steps of forming an EPROM transistor.

4. The method as recited in claim 1 wherein forming said non-volatile memory *floating-gate* transistor further comprises the steps of forming an EEPROM transistor.

5. The method as recited in claim 1 wherein forming said submicron CMOS transistor comprises the steps of forming a submicron CMOS N-channel transistor.

6. The method as recited in claim 1 wherein forming said submicron CMOS transistor comprises the steps of forming a submicron CMOS P-channel transistor.

7. The method as recited in claim 1 wherein said metallized contacts formed to said submicron CMOS transistor are formed contacting said source, drain and gate of said *submicron CMOS* transistor.

8. The method as recited in claim 1 wherein said thermal oxide *layer* is formed to a depth of approximately 300 angstroms over said non-volatile memory *floating-gate* transistor, *and said third gate oxide layer brings the oxide over said non-volatile memory floating-gate transistor to a desired final thickness of approximately 500 angstroms.*

9. The method as recited in claim 1 wherein said thermal oxide is removed from said first region using a wet HF etch.

10. The method as recited in claim 1 wherein said *third* gate oxide layer is formed to a [depth] *thickness* that is less than that of said first gate oxide layer.

11. The method as recited in claim 1 wherein said third gate oxide layer is formed to a depth of between 100 and 150 angstroms.

[12. The method as recited in claim 1 further including forming a plurality of said non-volatile memory transistors.]

[13. The method as recited in claim 1 further including forming a plurality of said submicron CMOS transistors.]

14. A method of forming a *non-volatile* CMOS memory cell *for use in the formation of an array of non-volatile memory cells, said method* comprising:

(*a*) forming a floating gate CMOS memory transistor *in a semiconductor substrate*, including (*i*) forming a first gate oxide layer on said substrate, (*ii*) forming a first polysilicon layer on said first gate oxide layer, (*iii*) forming a second gate oxide layer on said first polysilicon layer, (*iv*) *forming a second polysilicon layer on said second gate oxide layer, and*

(*v*) *selectively* etching said *first and second* polysilicon layers and said *first and second* gate oxide layers to leave a stack of said layers atop said substrate between a *first* source region and a *first* drain region, (*b*) subsequently forming a high performance CMOS transistor adjacent to said memory transistor, including (*i*) forming a third gate oxide *on a completely bare region of a surface of* layer on said substrate *that is adjacent to but* spaced apart from said *floating gate CMOS* memory transistor by a field oxide region, *said third gate oxide layer also being formed over said floating gate CMOS memory transistor,*

(*ii*) forming a third polysilicon layer on said third gate oxide layer, (*iii*) *selectively* etching said third polysilicon layer to leave a submicron gate separated from said *floating gate CMOS* memory transistor by a field oxide region, and (*iv*) doping said substrate proximate to said submicron gate *to form a second source region and a second drain region*, and (*c*) *forming metallized contacts coupling said second source region to said first drain region* such that said high performance *CMOS* transistor can electrically communicate with said *floating gate CMOS* memory transistor.

15. In a method of forming a *non-volatile* CMOS memory cell with a three-layer polysilicon process, the improvement comprising:

(*a*) forming a floating gate CMOS memory transistor in a first time interval, including (*i*) forming a first gate oxide layer on a substrate, (*ii*) forming a first polysilicon layer on said first gate oxide layer, (*iii*) forming a second gate oxide layer on said first polysilicon layer, (*iv*) forming a second polysilicon layer on said second gate oxide layer, *and*

(*v*) *selectively* etching said *first and second* polysilicon and gate oxide layers to leave a sense gate disposed above a floating gate disposed above a channel between a source region and a drain region of said substrate, [and]

(*b*) forming a high performance CMOS transistor in a second time interval, after the first time interval, including (*i*) forming a third gate oxide layer on a *bare* section of said substrate adjacent to said *floating gate CMOS* memory transistor, said section separated from said *floating gate CMOS* memory [cell] *transistor* by a field oxide region, (*ii*) forming a third polysilicon layer on said third gate oxide layer, (*iii*) *selectively* etching said third polysilicon layer to leave a gate atop said section, and (*iv*) doping said section around said gate to form electrically conductive regions, *and*

(*c*) *forming metallic contacts coupling one of said electrically conductive regions of said high performance CMOS transistor to said drain region of said floating gate CMOS memory transistor* such that said high performance *CMOS* transistor can electrically communicate with said *floating gate CMOS* memory transistor.

* * * * *

UNITED STATES PATENT AND TRADEMARK OFFICE

CERTIFICATE OF CORRECTION

PATENT NO. : RE 36,777
DATED : July 11, 2000
INVENTOR(S) : Bradley J. Larsen et al.

It is certified that error appears in the above-identified patent and that said Letters Patent is hereby corrected as shown below:

Column 6, claim 14,
Line 40, "adjacent to said memory transistor" should be deleted.

Signed and Sealed this

Thirtieth Day of October, 2001

*Attest:*

Nicholas P. Godici

NICHOLAS P. GODICI
*Acting Director of the United States Patent and Trademark Office*

*Attesting Officer*